United States Patent [19]

Moerschel

[11] Patent Number: 4,514,436
[45] Date of Patent: Apr. 30, 1985

[54] METHODS OF HIGHLIGHTING PINHOLES IN A SURFACE LAYER OF AN ARTICLE

[75] Inventor: Kenneth G. Moerschel, Bethlehem, Pa.

[73] Assignee: AT&T Technologies, Inc., New York, N.Y.

[21] Appl. No.: 518,189

[22] Filed: Jul. 28, 1983

[51] Int. Cl.³ .............................................. B05D 5/12
[52] U.S. Cl. .................................... 427/10; 204/1 T; 156/627; 430/30; 29/574
[58] Field of Search .................. 427/10; 156/626, 627; 204/1 T; 430/30; 29/574

[56] References Cited

U.S. PATENT DOCUMENTS

| 3,379,625 | 4/1968 | Csabi .................................. 204/1 T |
| 3,518,131 | 6/1970 | Glendinning ........................ 156/17 |
| 3,530,045 | 9/1970 | Alburger ............................. 204/1 T |
| 4,125,440 | 11/1978 | Markovits .......................... 204/1 T |
| 4,180,439 | 12/1979 | Deines et al. ...................... 204/1 T |

FOREIGN PATENT DOCUMENTS

| 475077 | 2/1968 | Japan ................................. 204/1 T |
| 1511348 | 5/1978 | United Kingdom ................ 204/1 T |

OTHER PUBLICATIONS

"Detecting Pinholes," *IBM Technical Disclosure Bulletin*, R. Auyang et al., vol. 12, No. 9, Feb. 1970.
"Metal Deposition Technique for Pinhole Analysis in Solid Dielectrics," *IBM Technical Disclosure Bulletin*, J. S. Lechaton et al., vol. 19, No. 9, Feb. 1977.

*Primary Examiner*—John D. Smith
*Assistant Examiner*—K. Jaconetty
*Attorney, Agent, or Firm*—W. O. Schellin

[57] ABSTRACT

A production control process includes a method of highlighting pinholes in a surface layer (37), such as a photoresist layer, of an article (31), such as a semiconductor wafer. The photoresist typically covers a dielectric base layer, such as an oxide layer (28). After a typical photoresist application, a typical test wafer (31) is submitted to an etching operation wherein pinhole sized defects in the photoresist layer (37) cause like defects to be etched through the underlying oxide layer (28). Thereafter, the wafer is submitted to an electrolytic treatment step, wherein the preferred process involves treating a positive photoresist in an alcohol with the wafer being cathodically coupled into the treating circuit. Activating light can be used simultaneously with the treatment. As an alternative, the photoresist is exposed prior to the electrolytic treatment of the wafer. During the electrolytic treatment the electrolytic fluid is activated in the immediate area of pinholes to act on the photoresist and dissolve the photoresist immediately about each of the pinholes. The resulting enlarged areas (46) of missing photoresist about each of the pinholes are readily recognized by visual inspection of the wafer (31) at the conclusion of the electrolytic treatment.

18 Claims, 5 Drawing Figures

METHODS OF HIGHLIGHTING PINHOLES IN A SURFACE LAYER OF AN ARTICLE

TECHNICAL FIELD

This invention relates to methods of highlighting pinholes in a surface layer of an article. The invention relates, for example, to visually determining pinhole densities in photoresist layers of in-process semiconductor wafers.

BACKGROUND OF THE INVENTION

In semiconductor wafer processing operations, as in many other mass processing operations, an undetected process error can possibly ruin an entire process lot of potential product. Reliable process controls appear necessary to avoid turning successful operations into disaster. However, process controls also need to be cost effective in that they may not unduly raise the cost of the ultimate product.

The present invention has been found to be of particular use in photolithographic operations which, according to current manufacturing techniques, precede most of the selective treatments of semiconductor wafers by which devices are formed in such wafers. In such photolithographic operations, a layer of photoresist is applied over the entire wafer. The applied layer of photoresist is first dried or baked, then typically selectively exposed and developed to open selected windows in the layer through which underlying areas of the wafer will be treated in a subsequent operation. During such treating operation, the wafer areas beneath the remaining photoresist layer remain protected.

Photoresist layers at times include defects in the form of pinholes extending through the applied layer. Pinholes tend to occur sporadically. When a pinhole exists in an area of the resist layer which is to be developed away during a subsequent operation, there is no adverse effect on the final product. If, however, the pinhole resides in an area of the resist layer which needs to remain intact to protect the underlying area of the wafer during a subsequent operation on the wafer, then the respective ultimate device is likely to be defective.

A cause for the occurrence of pinholes in the photoresist layers is not always determinable. Otherwise their occurrence could be avoided. However, various causes by which pinholes may occur are known such as the presence of small areas of contamination on the base layer of a semiconductor wafer to which the photoresist is applied. Areas of contamination may cause the wafer to be repellent to the photoresist such that a pinhole occurs in the photoresist above such contamination. Pinholes may also occur through particulate contaminations either on the surfaces of the wafers or in the photoresist.

Under normal process conditions pinholes are not expected to occur in significant numbers to produce serious yield affecting densities. However, since the sudden occurrence of pinholes may cause a significant loss of product, a statistical surveillance test has been adopted. According to the test, special test wafers are included in each lot of wafers being coated with a layer of photoresist. The test wafers typically have a dielectric sublayer of oxide onto which the photoresist is applied. After a typical drying operation, the test wafers are subjected to an oxide etch operation after which the photoresist is stripped and the oxide layer is inspected for pinholes.

During the oxide etch operation, the photoresist layer protects the oxide layer except where a pinhole exists in the photoresist layer and permits a pinhole-sized aperture to be etched through the oxide layer to the wafer itself. Pinholes are virtually impossible to detect even when the wafers are inspected through a microscope. The pinholes are small enough to typically blend in with other surface features and are consequently overlooked in a microscope scanning operation.

The operation of a commercially available pinhole density test apparatus helps to identify otherwise hard to detect pinholes. A wafer to be scanned through image enlarging optics, such as those found on a microscope or on an enlarging video camera, is mounted horizontally in a special wafer holder. The holder features a peripheral ridge about the wafer to permit the upward facing front surface of the wafer to be covered with an electrolytic fluid. An electrical contact to the backside of the wafer couples the wafer to an electrolytic circuit which is completed through any pinholes which might extend through the oxide covering the front surface of the wafer. In a typical embodiment of the test apparatus, an annular electrode touches the surface of the electrolytic fluid in a fringe area about the field of view of the scanning optics and remains stationary with respect to the optics. Consequently, any electrolytic action on the surface of the wafer due to pinholes through the oxide layer is concentrated in the field of view of the scanning optics.

The field of view is typically moved with respect to the wafer in a raster pattern which ultimately covers the entire wafer but without overlap. An electrolytic action has been found to cause gas bubbles to rise from pinholes. Such bubbles are much more visible than the pinholes themselves. In addition, typically a string of such bubbles rises through the fluid, like a streamer which points at its origin to the pinhole.

Nevertheless, scanning the test wafers in the described manner is time consuming and costly. Typically an entire production lot of wafers which had been subjected to the same resist coating operation is held up between the photoresist application and a subsequent selective treatment. On the basis of the pinhole count on the test wafer, a decision is made whether to strip and re-apply the photoresist on the production lot or whether to continue the process with the already applied resist.

It is now realized that economies can be obtained by reducing the delay in process time which is needed to determine whether the photoresist layer is of acceptable quality. Because typical semiconductor device processes are series of selective process steps, which repeatedly include photoresist operations, the total delay in the throughput of the device manufacture amounts to a considerable time interval.

SUMMARY OF THE INVENTION

Thus, in accordance with the invention, improved methods of highlighting pinholes in a dielectric surface layer of an article include generating an electrolytic reaction in an electrolytic fluid in the locality of the pinholes and dissolving the surface layer in a localized area about each of the pinholes.

BRIEF DESCRIPTION OF THE DRAWING

The invention will be better understood when the following detailed description is read in reference to the appended drawing wherein.

DETAILED DESCRIPTION

The Apparatus and Mode of Operation

Figure 1:
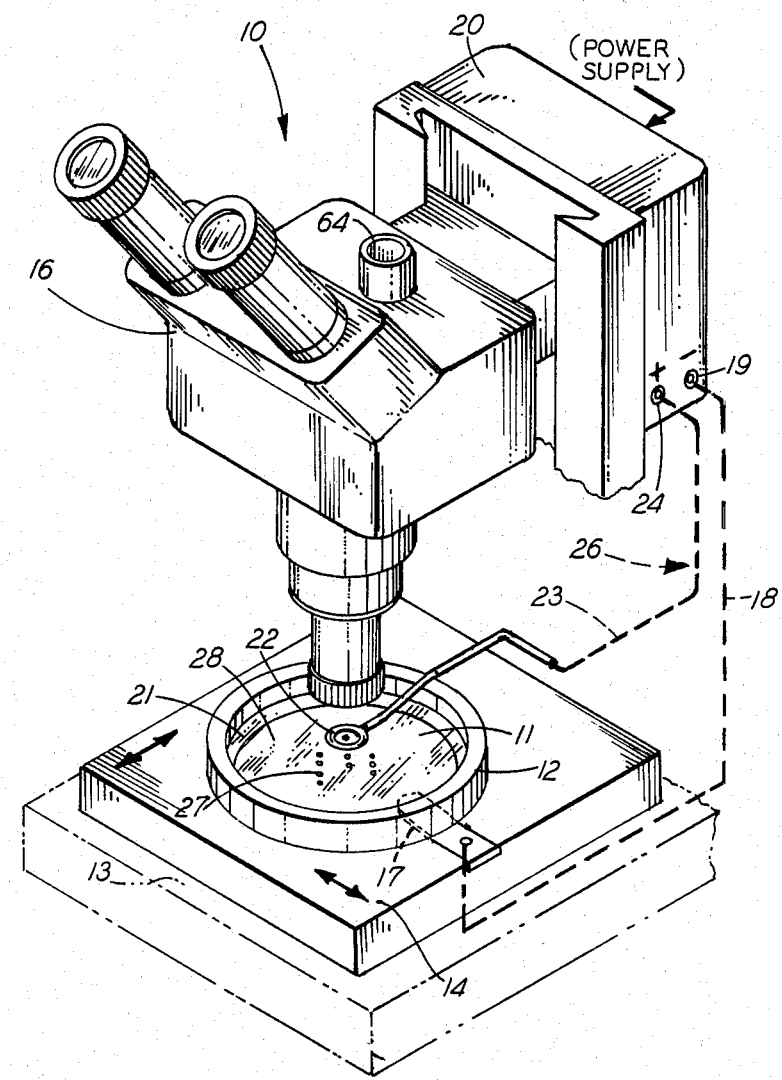
FIG. 1 is a drawing, partially schematic, of prior art electrolytic treating apparatus which may be used for practicing the present invention.

Referring to FIG. 1, there is shown pinhole detection apparatus designated generally by the numeral 10. The apparatus 10 functions in accordance with prior art principles to detect pinholes in oxide layers of semiconductor wafers. The wafer 11 which is seen in position in a cup-like wafer holder 12 of the apparatus 10 is a typical example of such wafers.

The wafer holder 12 is supported in a base structure 13 of the apparatus 10 by a support 14. The support 14 is movable in the horizontal plane with respect to a fixed field of view of a microscope 16 mounted to the base structure 13.

The wafer holder 12 is a metal cup and is therefore conductive. Thus, when one of the wafers 11 is placed into the wafer holder 12, the lower surface of the wafer 11 is in electrical contact with wafer holder 12. The wafer holder 12, in turn, rests on a contact element 17 which is coupled through conventional wiring 18 to a first terminal 19 of a power unit 20.

In the wafer holder 12 the wafer is covered by a liquid 21, such as methanol, to a convenient depth, typically between 1 and 5 mm. A contact ring 22 of a size which surrounds the field of view of the microscope 16 is attached to the microscope. A conductor 23 couples the contact ring 22 to a second terminal 24 of the power unit 20.

When the power unit 20 is turned on, an electrolytic treating circuit designated generally by the numeral 26 is established. The electrolytic action causes gas bubbles 27 to rise from pinholes in an otherwise continuous dielectric oxide layer 28 on an upper surface 29 of the wafer 11.

To test one of the wafers 11 with the apparatus 10, the wafer is placed into the wafer holder 12 as shown in FIG. 1. The wafer holder 12 contains methyl alcohol to a level of approximately 4 mm. The contact ring 22 is lowered to a distance of approximately 3 mm from the upper surface 29 of the wafer 11. A positive voltage of preferably between 30 volts and 100 volts is applied to the wafer 11 with respect to the contact ring 22. The potential difference causes the bubbles to rise through the methanol. Because the anode is located (the contact ring 22) peripherally about the field of view of the microscope 16, the bubbling becomes particularly active within the field of view of the microscope. The entire area of the wafer 11 is now scanned in a parallel-path motion, and the sites of bubble emergence are counted.

An Improved Method

Figure 2:
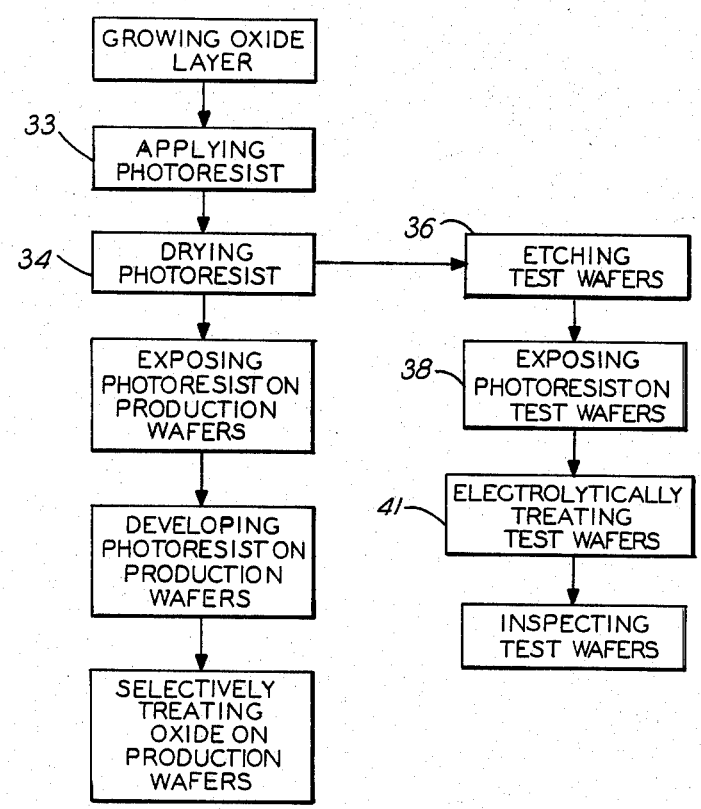
FIG. 2 shows a block diagram of a process including features of the present invention.

The time for examining one of the test wafers 11, or a similarly prepared test wafer 31 (see FIG. 3), is significantly reduced by a method which highlights pinhole-sized defects to permit visual inspection of a test wafer without a microscope. FIG. 2 shows a flow diagram of part of a wafer preparation process relating to a selective surface treatment operation on a production lot of wafers. A test wafer 31 is processed through a photoresist application 33 in the same manner as the production lot and is then subjected to a photoresist drying operation 34 together with the wafers of the production lot. The photoresist which is being applied in the above-described operation is a typical positive photoresist, the exposed areas of which are developed away in an alkaline developing solution. Such photoresist is commercially available, as, for example, from Shipley Chemical Corporation under the trade designation of 111-24 photoresist or from Hunt Chemical Corporation under the trade designation of 204 type or 206 type photoresist.

After the drying operation of the photoresist, further processing of the production lot of wafers is halted until after the test wafer 31 has been tested to determine whether its pinhole defect density is acceptable. If the defects exceed a certain, predetermined number, the applied photoresist on the production wafers will be stripped and reapplied with a prior effort to determine and eliminate causes which may have contributed to the presence of an excessive number of defects in the photoresist. In preparation for counting pinhole defects in the test wafer 31, the wafer is submitted to an etching step 36 wherein the applied photoresist layer 37 (see FIG. 5) protects the underlying oxide layer 28. However, the etching solution, such as a buffered HF solution, penetrates through defects in the photoresist layer 37 to etch away the oxide layer 28 which lies directly beneath such defects.

It should be noted that even though the description refers to subjecting a single test wafer 31 to certain described steps, more than one test wafer 31 can be included in any given production lot. Also, when a marginal number of defects is discovered on a test wafer 31, a production wafer from the corresponding production lot can be diverted to be used as an additional test wafer 31. The selected production lot wafer is simply subjected to the etching step 36 and is then subjected to an electrolytic treating step 41. Such additional wafer when tested like the wafer 31 offers added data on possible defect densities when previous test results may have been marginal or inconclusive, and the additional data are needed for a decision on whether the corresponding production lot should be processed in its present condition.

The photoresist on the wafer 31 may now be exposed and then immersed into an electrolytic bath, such as the methanol as described with respect to the prior art apparatus 10. As an alternative, a strong illumination sufficient for typical microscopic observation of an article is also apparently sufficient to expose the photoresist layer 37 after its immersion into electrolytic bath. For example, the prior art apparatus 10 can be used effectively to subject the wafer 31 to an electrolytic operation 41 in accordance with the features detailed herein.

The electrolytic operation 41 is preferably applied to the wafer 31 for a period of three to five minutes. Since the apparatus 10 does not treat all portions of the wafer 31 simultaneously, and such deficiency is overcome by relative movement between the wafer 31 and the smaller contact ring 22, the treatment is preferably applied for approximately five minutes, on the high end of the preferred time span. During such time span the wafer holder 12 is manipulated laterally with respect to the contact ring 22 in a similar scanning motion as in the prior art operation, even though in the present step 41 the wafer 31 need not be observed through the microscope 16 to detect defects.

During the electrolytic treatment step 41, the power unit 20 is set to a preferred voltage bias in the range between 40 and 60 volts. With such electrical bias on the wafer 31, an unusual and surprising change in the photoresist layer 37 takes place. In the vicinity of each pinhole 44, shown as a dot in an exaggerated size for purposes of illustration in FIG. 3, the photoresist layer 37 disappears, leaving a relatively large, open area, referred to as crater 46, about each pinhole in the layer 37 down to the oxide layer 28. The bared oxide layer 28 about each of the pinholes 44 is clearly visible with the unaided eye. After the electrolytic treating step 41 is completed, the wafer 31 is removed from the bath, as for example from the wafer holder 12 shown in FIG. 1, and is dried. A simple inspection of the wafer 31 clearly shows the locations of pinholes by the identifying craters 46 in the photoresist layer so that a decision can be made as to whether the photoresist layer on the wafers of the waiting production lot is acceptable.

The precise reason leading to the localized removal of the photoresist layer 37 is not known. However, an unmistakable correlation between the rising of gas bubbles at pinholes and the dissolving away of the photoresist in an immediate area about each of such pinhole sites links the electrolytic action to the localized removal of the photoresist layer. It can be theorized, for example, that the electrolytic action at the pinholes 44 generates an active radical which then reacts locally with the photoresist to dissolve the photoresist layer 37. However, it can also be theorized that a turbulence in the electrolytic fluid caused by the electrolytic action and by the generation of the bubbles may be a cause of the photoresist layer 37 becoming dissolved.

Figure 3:
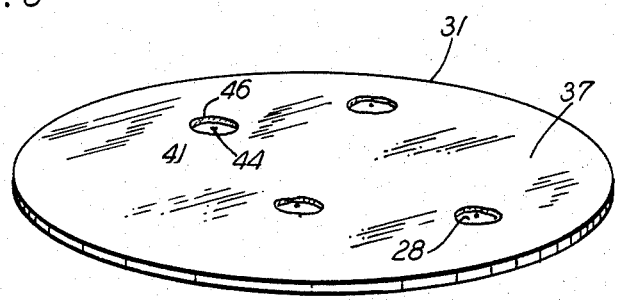
FIG. 3 shows a semiconductor wafer, a surface layer of which has been treated in accordance with the present invention.

FIG. 3 shows one of the wafers 31 after the completion of the electrolytic treatment step 41. Several of the craters 46 of missing photoresist indicate the presence of the pinholes 44 through the oxide layer 28 in the wafer 31. A similar number of pinholes can be inferred on each of the wafers in the production lot to which the test wafer 31 belongs. Depending on the size of the intended semiconductor chips on the wafers of the production lot, and on the number of similar photoresist and etching operations which remain to be completed in the course of the process, a yield loss in the product can be estimated. If such loss exceeds a practical desired yield, the cause for the loss needs to be remedied. For example, at this stage in the process the photoresist can be stripped from the production wafers and new photoresist can be reapplied to the production wafers along with another test wafer 31 as a repeat of step 33 and of the sequence leading to the inspection of the test wafer 31 as shown in FIG. 2.

ALTERNATE EMBODIMENTS AND EXAMPLES

Figure 4:
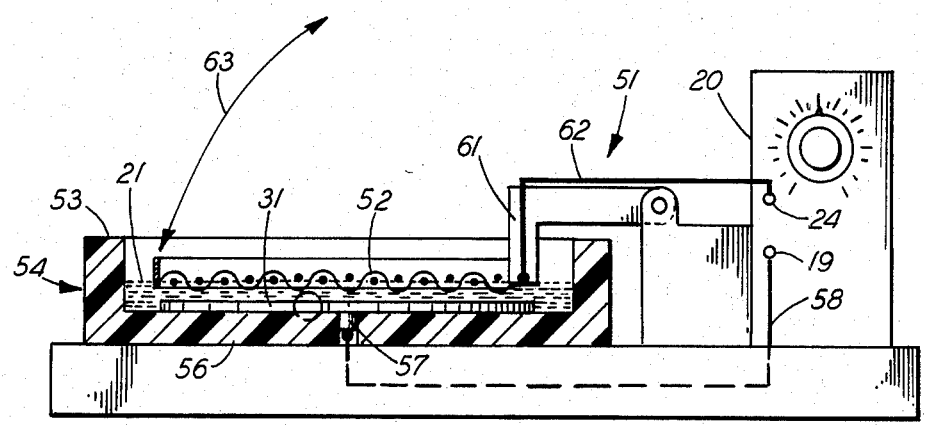
FIG. 4 shows in section apparatus having preferred features for practicing the present invention, the apparatus holding a semiconductor wafer such as the wafer in FIG. 3.

The apparatus 10 described in reference to FIG. 1 can be modified in various ways to simplify the electrolytic treating step of the wafer 31. Referring to FIG. 4, there is shown apparatus 51 as a preferred modification of the apparatus 10 for treating the wafer 31 to highlight the pinholes 44 in the surface layer, namely the photoresist layer 37. The numerals of elements of the apparatus 51 which are substantially the same in structure and function as their counterparts in the apparatus 10 have been given the same numerals as those elements of the apparatus 10.

The time interval for which the wafer 31 needs to be treated to highlight any existing pinholes 44 can be significantly reduced by substituting a screen-type electrode 52 for the annular shape of the contact ring 22. The size of the electrode 52 is substantially the same as the surface of the wafer 31. Consequently, all surface areas of the wafer 31 are subjected simultaneously and substantially equally to the influence of the electric field from the electrode 52. A need for relative movement between the electrode and the wafer is thereby obviated.

However, the periphery of the electrode 52 is now at all times close to a wall 53 of a wafer holder 54. To avoid electrolytic action between the periphery of the electrode 52 and the wall 53, the wall 53 and a base 56 of the wafer holder 54 are preferred to be of an inert, and a preferably resilient material, such as, for example, silicone rubber. An electrical contact element 57 is sealed into the base 56 of the holder 54 to provide an electrical connection through the base 56 via a standard conductor 58 from the conventional power unit 20. For ease of loading and unloading one of the wafers 31 into the wafer holder 54, the screen-type electrode 52 is mounted to a hinged arm 61 which also supports an electrical conductor 62 to the second terminal 24 of the power unit 20. The arm 61 with the electrode 52 is simply lifted as indicated by arrow 63 in FIG. 4 to load one of the wafers 31 to be tested into the wafer holder 54. Also, the apparatus 51 has no need for the microscope 16 shown in FIG. 1 since the wafer 31 can be inspected with the unaided eye after having been subjected to the electrolytic treatment.

The electrolytic fluid 21 covers the wafer 31 to substantially the same depth as described with respect to the apparatus 10. It has been found that some electrolytic fluids other than the known methanol produce bubbling action at the site of pinholes 44. Other alcohols, for example, produced the same reaction as the methanol. Commercial grades of alcohol which were used to produce the electrolytic treatment of wafers 31 may have contained typical small quantities of water. In each instance, the bubbling action at the site of the pinhole 44 is accompanied by the photoresist becoming dissolved about each of the pinholes.

EXAMPLE I

| | |
|---|---|
| Photoresist Layer: | Shipley 111-24 positive photoresist |
| Cathode-to-Wafer Spacing: | 3 mm |
| Electrolyte: | Methanol |
| Applied Voltage: | 30 to 100 volts |
| Treating Time: | approximately 1 minute |

| | |
|---|---|
| -continued | |
| Developed Area: | approximately 0.5 mm diameter |

In experiments made in accordance with the described parameters on the prior art apparatus 10, the photoresist layer was not exposed prior to placing the wafer 31 into the wafer holder 12. However, it was found that strong illumination from a lamp 64 on the microscope 16 shown in FIG. 1, was focused on the field of view of the microscope 16 and illuminated the wafer in an area substantially coincident with a projection of the outline of the contact ring 22 onto the wafer 31. It appears that the illumination provided by the lamp 64 exposes the photoresist layer 37 when the electrolytic action occurs, namely as each portion of the layer is moved into range of the contact ring 22.

To develop craters 46 about pinholes 44 into the photoresist layer with the apparatus 51, the photoresist layers 37 on the wafers 31 are exposed in a separate operation for a typical time period, as, for example, 30 seconds to an ultraviolet light source (not shown) after the etching step 36 and before the electrolytic step 41 as shown in FIG. 2. In the subsequent electrolytic step 41, the applied voltage was varied over the indicated range to observe changes in the electrolytic action. The electrolytic action increased with an increase in the applied voltage and decreased with a decrease in the applied voltage.

EXAMPLE II

In a second example, a developing action was observed in a similar manner as in Example I when ethanol ($CH_3CH_2OH$) was substituted for the previously used methanol ($CH_3OH$). Again bubbles were generated at the precise location of the pinhole 44 while the photoresist began to disappear from an increasing area about the pinhole. The voltages again were varied to various settings between 30 and 100 volts during the course of the treatment to observe an increase in the developing action as well as in the electrolytic action with an increased voltage. Observed crater diameters were in the range of 0.3 to 0.7 mm after approximately one minute of treatment. The purpose of the examples was to ascertain that an electrolytic fluid other than methanol could be used for the treatment.

EXAMPLE III

Isopropyl alcohol $(CH_3)_2CHOH$ was substituted for the ethyl alcohol of the previous example, and the treatment was repeated. Substantially the same results were observed with the isopropyl alcohol as with the methyl alcohol and ethyl alcohol of the previous examples. Again, the purpose of the substitution was to demonstrate the viability of the treatment in the presence of various electrolytes.

EXAMPLE IV

A mixture of water and of a commercial grade ethylene glycol was substituted for the alcohols of the previous example and the treatment of wafers 31 was repeated. Gas bubble generation was observed as in the previous examples. However, a greater viscosity of the mixture prevented the gas bubbles from rising to the surface of the liquid mixture at a sufficiently fast rate to clear the generated gas from the region about the pinholes. In the course of the treatment the electrolytic action was slow in comparison to that in the previously discussed examples. The decrease in the reaction is believed to be related to an accumulation of small gas bubbles in the vicinity of the pinholes. Thus, while the mixture produced a similar result on the photoresist layer, the viscosity of the mixture made the use of the mixture less desirable.

OTHER MODIFICATIONS

From the above description various changes and modifications in the methods and in the use of the methods within the spirit and scope of the invention come to light. For example, the invention is described with respect to semiconductor wafers. However, it stands to reason that whenever good manufacturing processes of other photolithographically treated articles call for similar process controls, the described improvements in checking photoresist layers for pinholes apply to such other articles as well.

Figure 5:
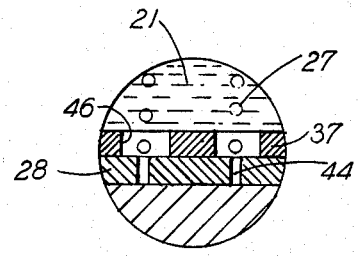
FIG. 5 shows an enlarged portion of the sectional view of the wafer shown in FIG. 4.

Also, the invention has been described with respect to a semiconductor test wafer 31, as shown in FIGS. 3 and 5. The photoresist layer 37 on such test wafer 31 is preferably applied over the oxide layer 28 as one type of dielectric layer. It should be understood, however, that the oxide dielectric layer 28 could also be a nitride dielectric layer, as, for example and without limitation, a silicon nitride layer. Such silicon nitride layers are also typically formed as so-called passivation layers in the course of manufacturing state-of-the-art semiconductor devices. The etching step could then necessarily be modified to substitute a silicon nitride etchant for the silicon oxide etchant in accordance with standard practices. The selection of the material of the layer, such as the layer 28, is guided by the type of material that is to be selectively treated following the photolithographic pattern definition.

It should also be kept in mind that the photoresist layer 37 itself is a dielectric layer. Thus as another modification of the described process, the photoresist layer 37 can be applied directly over the surface of any conductive base material of a semiconductor wafer including the semiconductor material itself or over any similarly conductive surface of an article other than a semiconductor wafer. When the underlying surface is electrically conducting, the etching step 36 prior to the electrolytic step 41 is deleted since the absence of an interposed dielectric layer, such as the oxide layer 28, obviates the need for the etching step 36. In the described preferred embodiment and in each of the variations of the described process, an entire product lot of articles, such as of semiconductor wafers, is enhanced by the speedy and accurate recognition of otherwise hard-to-detect pinhole defects. The enhancements are predicated on time saved in processing the articles by avoiding the delay incurred in testing the articles according to previously known techniques. Various other changes and modifications of the embodiments described herein are possible within the spirit and scope of the invention.

What is claimed is:

1. A method of highlighting pinholes in a dielectric layer on a surface of an article such pinholes having been formed in an etching process through similar pinholes in a protective photoresist layer covering the dielectric layer, which comprises:

submersing into a liquid at least a portion of the article including the photoresist layer covering the dielectric layer wherein pinholes are to be highlighted;

applying an electrical potential through the pinholes in the photoresist layer between the liquid and the article to dissolve, in regions adjacent to such pinholes, the photoresist layer in a localized reaction at an interface between the liquid and the article at each of the pinholes formed in the dielectric layer.

2. A method of highlighting pinholes in a dielectric surface layer of an article according to claim 1, wherein the article subjected to the method is a semiconductor wafer, the photoresist layer on such semiconductor wafer is applied to a first surface of the wafer, the liquid is an alcohol, and the step of submersing comprises submersing the wafer into the alcohol with the first surface of the layer of photoresist directed upward, electrically contacting a second, opposite and downward directed surface to a first electrode and contacting the alcohol with a second electrode in a plane spaced parallel to the upward directed first surface of the wafer, and wherein applying an electrical potential between the liquid and the article comprises applying a positive potential to the second electrode with respect to the first electrode in electrical contact with the second surface of the wafer, such that the size of pinholes in the photoresist layer become enlarged.

3. A method of highlighting pinholes in a dielectric surface layer of an article in accordance with claim 1, which further comprises exposing the photoresist prior to applying a positive potential to the second electrode.

4. A method of highlighting pinholes in a dielectric surface layer of an article in accordance with claim 1, wherein the lateral extent of the wafer exceeds the lateral extent of the second electrode in the plane parallel to the plane of the wafer, the method comprising moving the second electrode in a scanning pattern in the plane parallel to the plane of the wafer, and exposing the positive photoresist with a localized source of active light projected onto the photoresist in an area substantially coincident with a projection of the second electrode onto the wafer and applying a positive potential to the second electrode during such movement of the second electrode.

5. A method of highlighting pinholes in a dielectric surface layer of an article in accordance with claim 1, wherein the liquid is an alcohol selected from the of methyl alcohol, ethyl alcohol and isopropyl alcohol, and wherein the positive potential applied to the second electrode is in a range between thirty and one hundred volts with respect to the potential at the first electrode and wherein the second electrode is spaced from the surface of the wafer by a distance in the range between two and five millimeter.

6. A method of highlighting pinholes in a dielectric surface layer of a test wafer for statistically determining pinhole densities in a production lot of such wafers, which comprises:
    applying a layer of photoresist to a first surface of each of the wafers in the production lot of wafers and to a first surface of said test wafer;
    exposing the layer of photoresist on the surface of the test wafer to a photoresist-activating light source;
    submersing the test wafer in an electrolytic treating liquid and contacting a second surface opposite to said first surface to a first contact of an electrolytic treating circuit;
    contacting the electrolytic treating liquid with a second contact of an electrolytic treating circuit;
    activating the electrolytic treating circuit; and
    thereafter visually inspecting the wafer to observe any pinhole defects in the layer of photoresist by visually discernible craters formed in the otherwise continuous layer of photoresist, such number of discernible craters with the photoresist being indicative of the number of pinhole defects in the applied, unexposed layer of photoresist on each of the wafers of said production lot of wafers.

7. A method of highlighting pinholes in accordance with claim 6, which comprises:
    prior to applying said layer of photoresist, forming a dielectric base layer on said first surface of each of the wafers of the production lot of wafers and on said first surface of said test wafer; and
    after applying said layer of photoresist, subjecting said first surface of said test wafer to an etching treatment to dissolve said formed dielectric base layer in areas which are not protected by said applied layer of photoresist, such that any pinhole defects in the layer of photoresist cause pinhole defects to be etched coextensively through said dielectric base layer on said first surface of the test wafer.

8. A method of highlighting pinholes in accordance with claim 7, wherein the step of applying a layer of photoresist comprises applying a layer of positive photoresist capable of being developed in an alkaline solution, and wherein activating the electrolytic treating circuit comprises electrically biasing said first terminal with a negative voltage with respect to said second terminal.

9. A method of highlighting pinholes in accordance with claim 8, wherein submersing the test wafer in an electrolytic treating liquid comprises submersing the test wafer in alcohol.

10. A method of fabricating a semiconductor device, which comprises:
    forming a dielectric layer on a first surface of at least two semiconductor wafers, including at least one test wafer;
    applying a photoresist layer over the dielectric layer of each of said at least two semiconductor wafers;
    submitting at least one test wafer to an etching operation wherein the photoresist layer of such at least one test wafer becomes exposed to an etchant capable of penetrating openings in the photoresist layer and of etching away the dielectric layer coextensively with such openings in the photoresist layer;
    rinsing said at least one test wafer submitted to such etching operation;
    treating the first surface of the at least one test wafer in an electrolytic operation wherein an electrical potential is applied between the at least one test wafer and an electrolytic fluid in contact with the photoresist layer of said at least one test wafer to electrolytically generate gas at any pinhole-sized openings in the photoresist layer and the dielectric layer of the at least one test wafer and to dissolve the photoresist layer in an area about each of any such pinhole-sized openings, whereby visually discernible craters void of photoresist are formed on the first surface of the at least one test wafer about each of any such pinhole-sized openings; and
    inspecting the at least one test wafer for the presence and number of any such craters on the first surface of the test wafer to inductively establish a similar presence and number of pinhole-sized openings in the photoresist layer of the remainder of said at least two semiconductor wafers, whereby a decision can be made whether to submit the remainder of said at least two semiconductor wafers to selective exposure of the respective photoresist layer.

11. A method of fabricating a semiconductor device according to claim 10, wherein forming a dielectric layer on a first surface of at least two semiconductor wafers comprises forming an oxide layer on such first surface of at least two semiconductor wafers including at least one test wafer.

12. A method of fabricating a semiconductor device according to claim 10, wherein treating the at least one surface of the at least one test wafer in an electrolytic operation comprises:

placing said at least one test wafer in a wafer holder such that a second surface of such test wafer rests in electrical contact with a first electrode of an electrolytic treating circuit and the first surface is directed upward;

covering the first surface of the at least one test wafer with an electrolytic fluid; and contacting the electrolytic fluid with a second electrode of the electrolytic treating circuit.

13. A method of fabricating a semiconductor device according to claim 12, wherein covering the first surface of the at least one test wafer with an electrolytic fluid comprises covering the first surface of the at least one test wafer with alcohol.

14. A method of fabricating a semiconductor device according to claim 12, wherein treating the first surface of the at least one test wafer further comprises:

generating relative movement between the second electrode and the at least one test wafer in a plane parallel to the first surface of the at least one test wafer; and exposing the photoresist layer with a photoresist activating source of illumination in an area about such second electrode while generating the relative movement.

15. A method of fabricating a semiconductor device according to calim 14, wherein covering the first surface of the at least one test wafer with an electrolytic fluid comprises covering the first surface of the at least one test wafer with alcohol.

16. A method of fabricating a semiconductor device according to claim 12, which further comprises:

exposing the photoresist layer of the at least one test wafer prior to treating the first surface of the at least one test wafer.

17. A method of fabricating a semiconductor device according to claim 16, wherein covering the first surface of the at least one test wafer with an electrolytic fluid comprises covering the first surface of the at least one test wafer with methanol.

18. A method of fabricating a semiconductor device according to claim 17, wherein forming a dielectric layer on a first surface of at least two semiconductor wafers comprises forming an oxide layer on such first surface of at least two semiconductor wafers including at least one test wafer.

* * * * *

UNITED STATES PATENT AND TRADEMARK OFFICE
CERTIFICATE OF CORRECTION

PATENT NO. : 4,514,436
DATED : April 30, 1985
INVENTOR(S) : K. G. MOERSCHEL

It is certified that error appears in the above—identified patent and that said Letters Patent is hereby corrected as shown below:

In the claims, Column 9, claim 5, line 45, "from the of" should read --from the group of--.
Column 12, claim 15, line 13, "calim" should read --claim--.

Signed and Sealed this

Eighth Day of October 1985

[SEAL]

Attest:

Attesting Officer

DONALD J. QUIGG

Commissioner of Patents and
Trademarks—Designate